United States Patent
Higo et al.

(10) Patent No.: US 11,515,436 B2
(45) Date of Patent: Nov. 29, 2022

(54) PHOTOVOLTAIC DEVICE AND PHOTOVOLTAIC UNIT

(71) Applicant: SHARP KABUSHIKI KAISHA, Sakai (JP)

(72) Inventors: Teruaki Higo, Sakai (JP); Chikao Okamoto, Sakai (JP); Masamichi Kobayashi, Sakai (JP); Masahito Ishii, Sakai (JP); Takeshi Mori, Sakai (JP); Yuta Matsumoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/668,058

(22) Filed: Feb. 9, 2022

(65) Prior Publication Data

US 2022/0271178 A1 Aug. 25, 2022

Related U.S. Application Data (62) Division of application No. 16/326,182, filed as application No. PCT/JP2017/029280 on Aug. 14, 2017, now abandoned.

(30) Foreign Application Priority Data

Aug. 15, 2016 (JP) .............................. JP2016-159105

(51) Int. Cl.
*H01L 31/0224* (2006.01)
*H01L 31/0747* (2012.01)
(Continued)

(52) U.S. Cl.
CPC ............... *H01L 31/022433* (2013.01); *H01L 31/02013* (2013.01); *H01L 31/02363* (2013.01);
(Continued)

(58) Field of Classification Search
CPC ....... H01L 31/022433; H01L 31/02013; H01L 31/022441; H01L 31/02363
See application file for complete search history.

(56) References Cited

U.S. PATENT DOCUMENTS

| 5,935,344 A | 8/1999 | Endo et al. |
| 2015/0214398 A1 | 7/2015 | Watahiki et al. |

(Continued)

FOREIGN PATENT DOCUMENTS

| JP | H09-129904 A | 5/1997 |
| JP | 2015-162483 A | 9/2015 |

(Continued)

OTHER PUBLICATIONS

Requirement for Restriction/Election dated Feb. 5, 2020 for U.S. Appl. No. 16/326,182.

(Continued)

*Primary Examiner* — Tae-Sik Kang
(74) *Attorney, Agent, or Firm* — ScienBiziP, P.C.

(57) ABSTRACT

A photovoltaic device includes: a p- or n-type semiconductor substrate; a p-type amorphous semiconductor film and an n-type amorphous semiconductor film on a first-face side; p-electrodes on the p-type amorphous semiconductor film; and n-electrodes on the n-type amorphous semiconductor film, wherein: the p-electrodes and the n-electrodes are arranged at intervals; the p-type amorphous semiconductor film surrounds the n-type amorphous semiconductor film in an in-plane direction of the semiconductor substrate; the n-type amorphous semiconductor film has an edge portion providing an overlapping region where the n-type amorphous semiconductor film overlaps the p-type amorphous semiconductor film; and the n-electrodes are disposed in areas of the n-type amorphous semiconductor film that are surrounded by the overlapping region.

6 Claims, 11 Drawing Sheets

(51) Int. Cl.
*H01L 31/0352* (2006.01)
*H01L 31/0236* (2006.01)
*H01L 31/20* (2006.01)
*H01L 31/02* (2006.01)

(52) U.S. Cl.
CPC ............ *H01L 31/022441* (2013.01); *H01L 31/035272* (2013.01); *H01L 31/0747* (2013.01); *H01L 31/202* (2013.01); *Y02E 10/50* (2013.01)

(56) References Cited

U.S. PATENT DOCUMENTS

| | | |
|---|---|---|
| 2015/0357491 A1 | 12/2015 | Kimoto |
| 2015/0372172 A1 | 12/2015 | Kimoto |
| 2018/0248054 A1 | 8/2018 | Asano et al. |

FOREIGN PATENT DOCUMENTS

| | | |
|---|---|---|
| WO | 2013/027591 A1 | 2/2013 |
| WO | 2014/034677 A1 | 3/2014 |
| WO | 2014/136715 A1 | 9/2014 |
| WO | 2014/157525 A1 | 10/2014 |
| WO | 2016/132902 A1 | 8/2016 |
| WO | 2017/038733 A1 | 3/2017 |

OTHER PUBLICATIONS

Non-Final Office Action dated Jun. 5, 2020 for U.S. Appl. No. 16/326,182.
Final Office Action dated Nov. 17, 2020 for U.S. Appl. No. 16/326,182.
Non-Final Office Action dated May 3, 2021 for U.S. Appl. No. 16/326,182.
Notice of Allowance and Fee(s) Due dated Nov. 10, 2021 for U.S. Appl. No. 16/326,182.

PHOTOVOLTAIC DEVICE AND PHOTOVOLTAIC UNIT

TECHNICAL FIELD

The present invention relates to photovoltaic devices and photovoltaic units. The present application is a divisional of U.S. patent application Ser. No. 16/326,182, filed Feb. 15, 2019, which is the National Stage of International Application No. PCT/JP2017/029280, filed Aug. 14, 2017, which claims priority to Japanese Patent Application, Tokugan, No. 2016-159105 filed on Aug. 15, 2016, the entire contents of which are incorporated herein by reference.

BACKGROUND ART

Solar cells are capable of directly converting solar energy to electric energy and increasingly expected as a next-generation energy source, particularly in view of global environmental problems. The solar cells that are currently most popularly manufactured and sold have electrodes formed on both sides: a light-receiving face through which sunlight enters the cell and a back face opposite the light-receiving face.

The electrodes on the light-receiving face, however, reflect and absorb sunlight. Incident light available for conversion decreases by as much as the light that hits the area occupied by the electrodes. Development is therefore underway for a back-contacted solar cell that includes electrodes only on the back face thereof (see, for example, Patent Literature 1).

CITATION LIST

Patent Literature

Patent Literature 1: PCT International Application Publication No. WO2013/027591

SUMMARY OF INVENTION

Technical Problem

Back-contacted solar cells are expected to improve their current collection efficiency.

Solution to Problem

The present disclosure, in an embodiment thereof, is directed to a photovoltaic device including: a p- or n-type semiconductor substrate; a p-type amorphous semiconductor film on a first-face side of the semiconductor substrate; an n-type amorphous semiconductor film on the first-face side of the semiconductor substrate; p-electrodes on the p-type amorphous semiconductor film; and n-electrodes on the n-type amorphous semiconductor film, wherein: the p-electrodes and the n-electrodes are arranged at intervals; the p-type amorphous semiconductor film surrounds the n-type amorphous semiconductor film in an in-plane direction of the semiconductor substrate; the n-type amorphous semiconductor film has an edge portion providing an overlapping region where the n-type amorphous semiconductor film overlaps the p-type amorphous semiconductor film; and the n-electrodes are disposed in areas of the n-type amorphous semiconductor film that are surrounded by the overlapping region.

The present disclosure, in an embodiment thereof, is directed to a photovoltaic unit including: the photovoltaic device; and a wiring sheet, wherein: the wiring sheet includes an insulating base member, first wires on the insulating base member, and second wires on the insulating base member; the p-electrodes are electrically connected to the first wires; and the n-electrodes are electrically connected to the second wires.

Advantageous Effects of Invention

The present disclosure, in an embodiment thereof, can collect current with improved efficiency.

DESCRIPTION OF EMBODIMENTS

The following will describe heterojunction back-contact cells in accordance with Embodiments 1 to 8 as examples of the photovoltaic device in accordance with embodiments of this disclosure and also describe heterojunction back-contact cells complete with a wiring sheet as an example of the photovoltaic unit in accordance with embodiments of this disclosure. The same reference numerals in the drawings referred to in the description of embodiments denote identical or equivalent members.

Embodiment 1

Structure of Heterojunction Back-Contact Cell

Figure 1A:
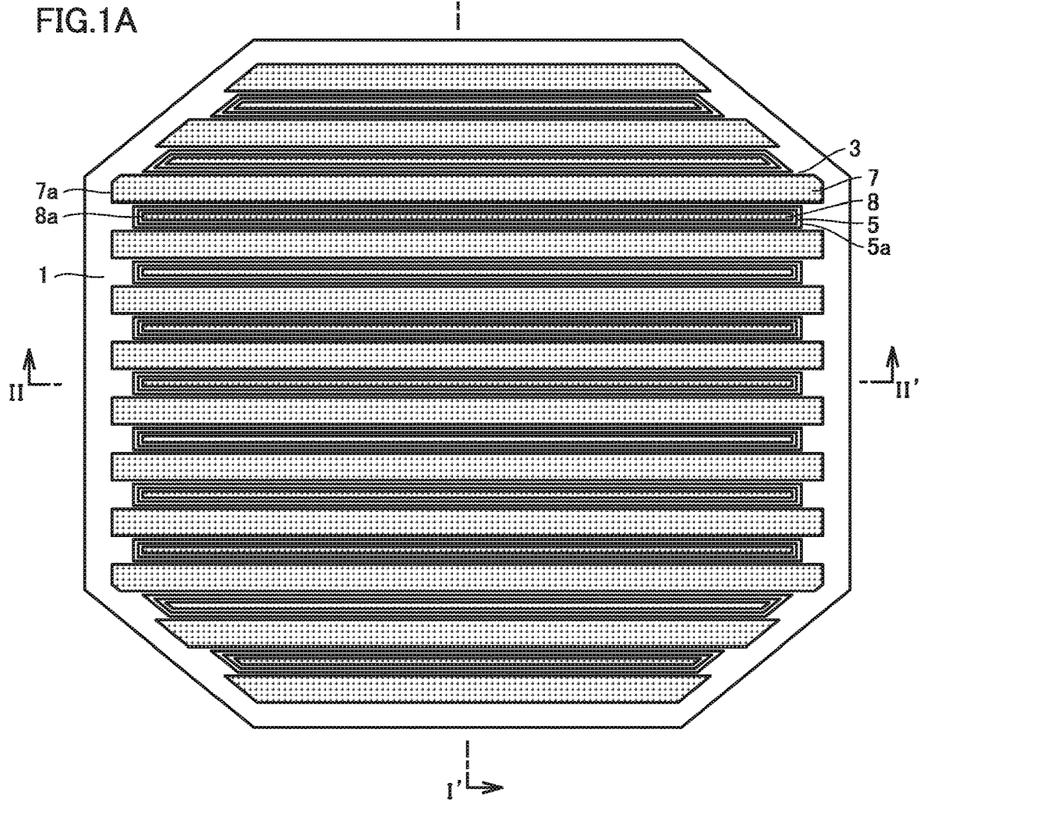
FIG. 1A is a schematic plan view of a back face of a heterojunction back-contact cell in accordance with Embodiment 1.
Figure 1B:
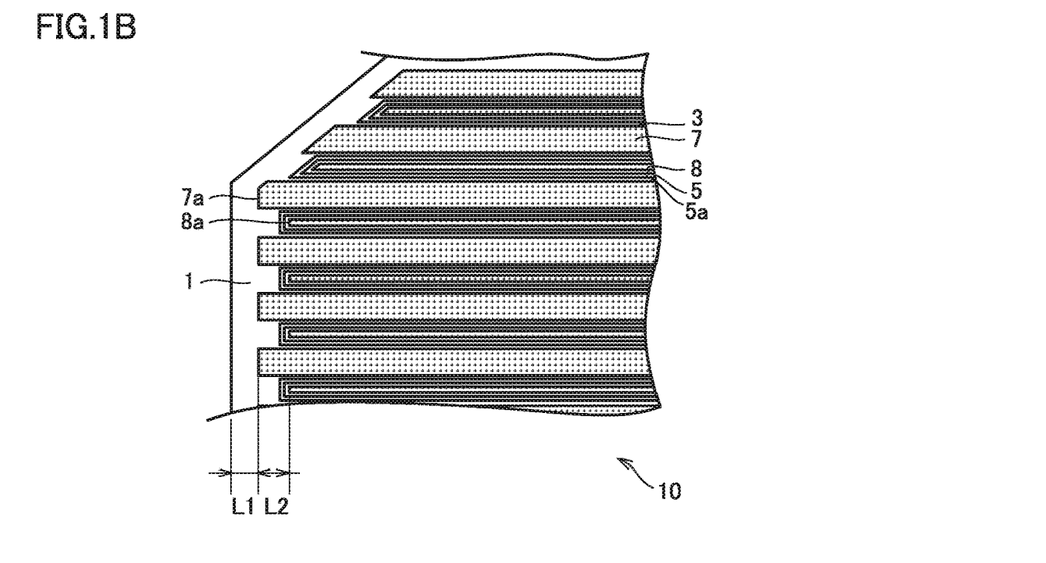
FIG. 1B is a schematic enlarged plan view of the back face of the heterojunction back-contact cell in accordance with Embodiment 1.

FIG. 1A is a schematic plan view of a back face of a heterojunction back-contact cell 10 in accordance with Embodiment 1. FIG. 1B is a schematic enlarged plan view of the back face of the heterojunction back-contact cell 10 in accordance with Embodiment 1. Referring to FIGS. 1A and 1B, the heterojunction back-contact cell 10 in accordance with Embodiment 1 includes p-electrodes 7 and n-electrodes 8 on the back face of an n-type semiconductor substrate 1. The p-electrodes 7 are disposed on a p-type amorphous semiconductor film 3, and the n-electrodes 8 are disposed on an n-type amorphous semiconductor film 5. The p-electrodes 7 and the n-electrodes 8, each shaped like a rectangular island, are arranged at intervals and extended in the same direction toward the periphery of the n-type semiconductor substrate 1. Each p-electrode 7 is extended toward the periphery of the n-type semiconductor substrate 1 beyond proximate ends 8a of the adjacent n-electrodes 8. An end 7a of the p-electrode 7 is separated from the periphery of the n-type semiconductor substrate 1 by a distance L1 that may be from 0 mm to 1 mm inclusive. The end 7a of the p-electrode 7 is separated from the proximate ends 8a of the adjacent n-electrodes 8 by a distance L2 that may be from 0.3 mm to 2 mm inclusive. The distance L1 refers to the shortest distance from the end 7a of the p-electrode 7 to the periphery of the n-type semiconductor substrate 1. The distance L2 refers to a difference between the shortest distance from the end 7a of the p-electrode 7 to the periphery of the n-type semiconductor substrate 1 (L1) and the shortest distance from the proximate end 8a of the adjacent n-electrode 8 to the periphery of the n-type semiconductor substrate 1.

This structure, in which each p-electrode 7 is extended toward the periphery of the n-type semiconductor substrate 1 beyond the ends 8a of the adjacent n-electrodes 8, may not be applied, for example, to parts of the n-type semiconductor substrate 1 where alignment and/or other marks exist and to the corners of the substrate 1 where the substrate 1 may have a curved edge.

FIGS. 1A and 1B show the structure of the p-electrodes 7 and the n-electrodes 8 near an edge of the back face of the heterojunction back-contact cell 10 in accordance with Embodiment 1. The p-electrodes 7 and the n-electrodes 8 have the same structure on the opposite edge as the structure shown in FIGS. 1A and 1B. Therefore, neither the p-electrodes 7 nor the n-electrodes 8 are shaped like a comb.

Figure 2A:
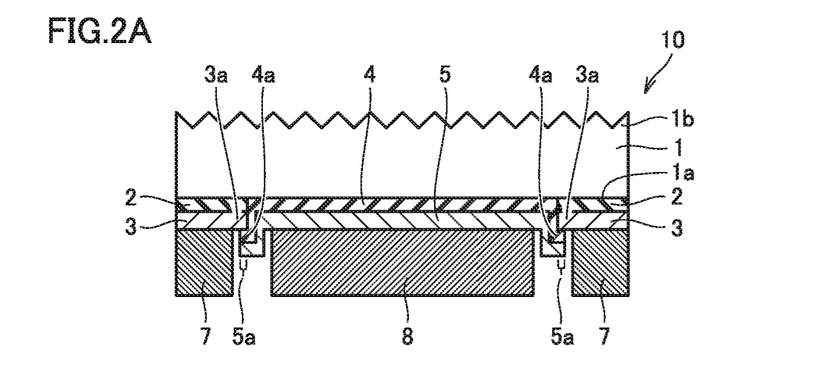
FIG. 2A is a schematic enlarged partial cross-sectional view of the heterojunction back-contact cell in accordance with Embodiment 1 taken along line I-I'.

FIG. 2A is a schematic enlarged partial cross-sectional view of the heterojunction back-contact cell 10 in accordance with Embodiment 1 taken along line I-I'. Referring to FIG. 2A, an i-type amorphous semiconductor film 4 and the n-type amorphous semiconductor film 5 are provided in this sequence on parts of the back face ("first face 1a") of the n-type semiconductor substrate 1. Meanwhile, an i-type amorphous semiconductor film 2 and the p-type amorphous semiconductor film 3 are provided in this sequence on other parts of the first face 1a of the n-type semiconductor substrate 1. The p-electrodes 7 are disposed on the p-type amorphous semiconductor film 3. The n-electrodes 8 are disposed on the n-type amorphous semiconductor film 5. There may be no i-type amorphous semiconductor film 4 between the n-type semiconductor substrate 1 and the n-type amorphous semiconductor film 5. There may be no i-type amorphous semiconductor film 2 between the n-type semiconductor substrate 1 and the p-type amorphous semiconductor film 3.

Still referring to FIG. 2A, the n-type amorphous semiconductor film 5 has an edge portion 5a thereof located above an edge portion 3a of the p-type amorphous semiconductor film 3. The i-type amorphous semiconductor film 4 has an edge portion 4a thereof located between the edge portion 3a of the p-type amorphous semiconductor film 3 and the edge portion 5a of the n-type amorphous semiconductor film 5. The edge portion 5a of the n-type amorphous semiconductor film 5 is an "overlapping region" where the n-type amorphous semiconductor film 5 overlaps the edge portion 3a of the p-type amorphous semiconductor film 3.

Figure 2B:
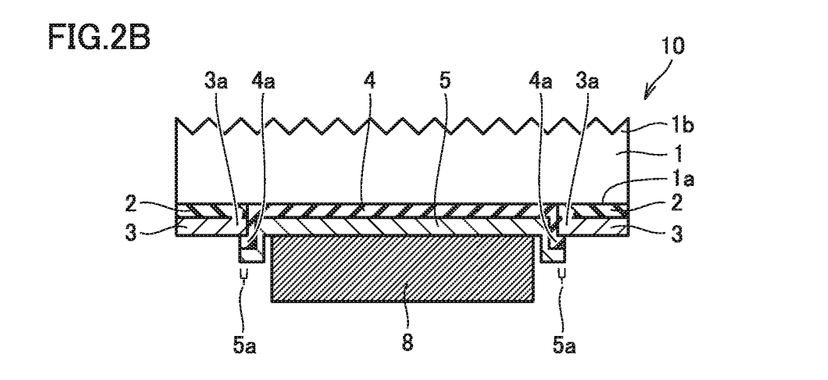
FIG. 2B is a schematic enlarged partial cross-sectional view of the heterojunction back-contact cell in accordance with Embodiment 1 taken along line II-IF.

FIG. 2B is a schematic cross-sectional view of the heterojunction back-contact cell 10 in accordance with Embodiment 1 taken along line II-II'. Similarly to FIG. 2A, FIG. 2B shows the edge portion 5a of the n-type amorphous semiconductor film 5 being an overlapping region where the n-type amorphous semiconductor film 5 overlaps the edge portion 3a of the p-type amorphous semiconductor film 3.

Referring to FIGS. 2A and 2B, the n-type semiconductor substrate 1 has texture or a like irregular structure on a light-receiving face thereof ("second face 1b"). There may be provided a dielectric film (not shown) on the second face 1b of the n-type semiconductor substrate 1.

The p-type amorphous semiconductor film 3 surrounds the n-type amorphous semiconductor film 5 in the in-plane direction of the semiconductor substrate as can be understood in FIGS. 1A, 1B, 2A, and 2B. The n-electrodes 8 are disposed in the areas of the n-type amorphous semiconductor film 5 that are surrounded by the edge portion 5a (overlapping region) of the n-type amorphous semiconductor film 5.

Method of Manufacturing Heterojunction Back-Contact Cell

Figure 3:
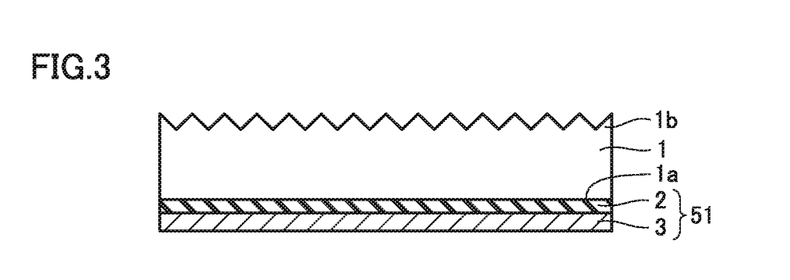
FIG. 3 is a schematic cross-sectional view illustrating an example method of manufacturing the heterojunction back-contact cell in accordance with Embodiment 1.

The following will describe an example method of manufacturing of the heterojunction back-contact cell 10 in accordance with Embodiment 1 in reference to the schematic cross-sectional views in FIGS. 3 to 9. The n-type semiconductor substrate 1 has texture or a like irregular structure formed on the second face 1b in advance. As shown in FIG. 3, the i-type amorphous semiconductor film 2 is first formed in such a manner as to come into contact with the entire first face 1a of the n-type semiconductor substrate 1. The p-type amorphous semiconductor film 3 is then formed in such a manner as to come into contact with an entire face of the i-type amorphous semiconductor film 2. A first laminate 51 is thus formed that is a laminate of the i-type amorphous semiconductor film 2 and the p-type amorphous semiconductor film 3. The i-type amorphous semiconductor film 2 and the p-type amorphous semiconductor film 3 may be formed by any method (e.g., plasma CVD (chemical vapor deposition)).

The n-type semiconductor substrate 1 is preferably, but not necessarily, an n-type monocrystalline silicon substrate and may be, for example, any conventionally known appropriate n-type semiconductor substrate.

The i-type amorphous semiconductor film 2 is preferably, but not necessarily, an i-type amorphous silicon film and may be, for example, any conventionally known i-type amorphous semiconductor film.

The "i-type" semiconductor in the present embodiment does not only refer to a completely intrinsic semiconductor, but also encompasses semiconductors contaminated with an n- or p-type impurity of sufficiently low concentration (both the n-type impurity concentration and the p-type impurity concentration are lower than $1 \times 10^{15}$ atoms/cm$^3$).

The "amorphous silicon" in the present embodiment does not only refer to amorphous silicon containing silicon atoms with a dangling bond (i.e., an unhydrogenated end), but also encompasses hydrogenated amorphous silicon and other like silicon containing no atoms with a dangling bond.

The p-type amorphous semiconductor film 3 is preferably, but not necessarily, a p-type amorphous silicon film and may be, for example, any conventionally known p-type amorphous semiconductor film.

The p-type amorphous semiconductor film 3 may contain, for example, boron as a p-type impurity. The "p-type" semiconductor in the present embodiment has a p-type impurity concentration of at least $1 \times 10^{15}$ atoms/cm$^3$.

Figure 4:
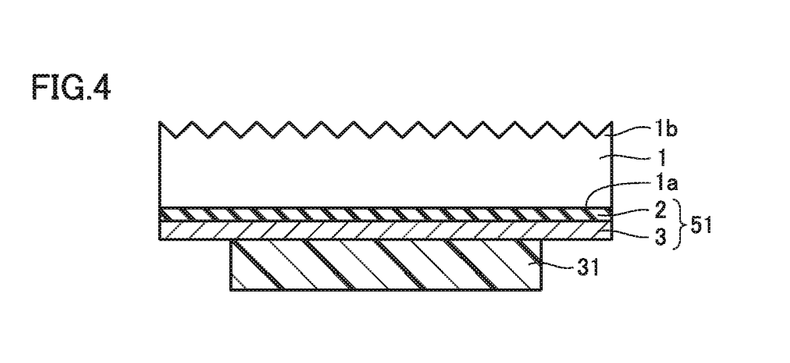
FIG. 4 is a schematic cross-sectional view illustrating the example method of manufacturing the heterojunction back-contact cell in accordance with Embodiment 1.

Next, as shown in FIG. 4, an etching paste 31 is applied onto the p-type amorphous semiconductor film 3. The etching paste 31 may be any material capable of etching the first laminate 51.

Figure 5:
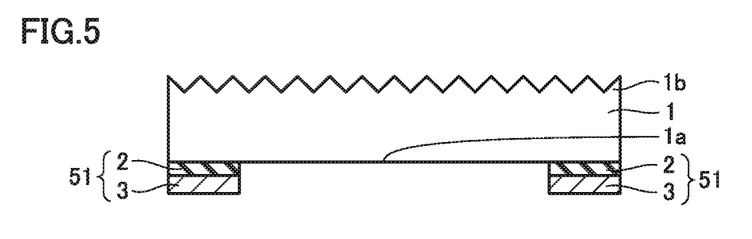
FIG. 5 is a schematic cross-sectional view illustrating the example method of manufacturing the heterojunction back-contact cell in accordance with Embodiment 1.

The etching paste 31 is then heated to etch out parts of the first laminate 51 in the thickness direction thereof. This etching exposes parts of the first face 1a of the n-type semiconductor substrate 1, for example, as shown in FIG. 5.

Figure 6:
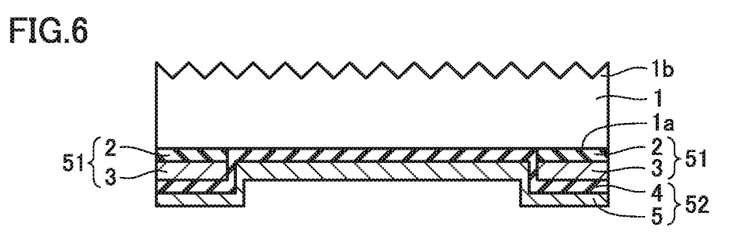
FIG. 6 is a schematic cross-sectional view illustrating the example method of manufacturing the heterojunction back-contact cell in accordance with Embodiment 1.

Subsequently, the i-type amorphous semiconductor film 4 is formed so as to come into contact with both the first laminate 51 and the exposed parts of the first face 1a of the n-type semiconductor substrate 1 as shown in FIG. 6. Thereafter, the n-type amorphous semiconductor film 5 is formed so as to come into contact with an entire face of the i-type amorphous semiconductor film 4. A second laminate 52 is thus formed that is a laminate of the i-type amorphous semiconductor film 4 and the n-type amorphous semiconductor film 5. The i-type amorphous semiconductor film 4 and the n-type amorphous semiconductor film 5 may be formed by any method (e.g., plasma CVD).

The i-type amorphous semiconductor film 4 is preferably, but not necessarily, an i-type amorphous silicon film and may be, for example, any conventionally known i-type amorphous semiconductor film.

The n-type amorphous semiconductor film 5 is preferably, but not necessarily, an n-type amorphous silicon film and may be, for example, any conventionally known n-type amorphous semiconductor film.

The n-type amorphous silicon film constituting the n-type amorphous semiconductor film 5 may contain, for example, phosphorus as an n-type impurity. The "n-type" semiconductor in the present embodiment has an n-type impurity concentration of at least $1 \times 10^{15}$ atoms/cm$^3$.

Figure 7:
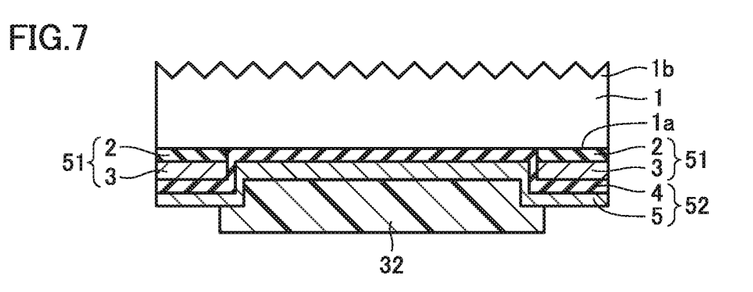
FIG. 7 is a schematic cross-sectional view illustrating the example method of manufacturing the heterojunction back-contact cell in accordance with Embodiment 1.

Next, as shown in FIG. 7, an etching mask 32 is placed on the n-type amorphous semiconductor film 5. The etching mask 32 may be made of any material that is capable of serving as a mask in the etching of the second laminate 52.

Figure 8:
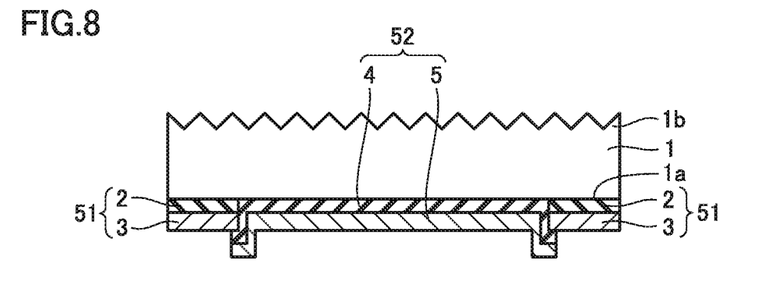
FIG. 8 is a schematic cross-sectional view illustrating the example method of manufacturing the heterojunction back-contact cell in accordance with Embodiment 1.

Next, parts of the second laminate 52 are etched out in the thickness direction thereof using the etching mask 32 as a mask. The etching mask 32 is then removed. This etching exposes parts of the surface of the p-type amorphous semiconductor film 3, for example, as shown in FIG. 8.

Figure 9:
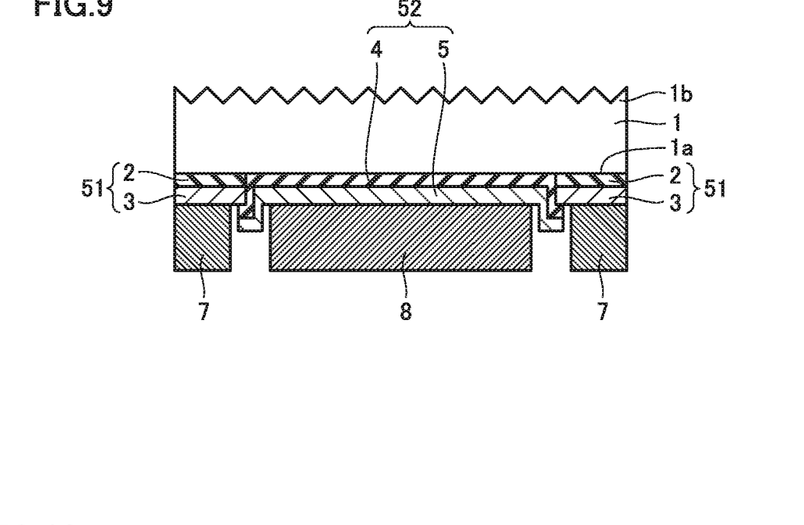
FIG. 9 is a schematic cross-sectional view illustrating the example method of manufacturing the heterojunction back-contact cell in accordance with Embodiment 1.

Thereafter, the p-electrodes 7 are formed on the p-type amorphous semiconductor film 3, and the n-electrodes 8 are formed on the n-type amorphous semiconductor film 5 as shown in FIG. 9, which completes the manufacture of the heterojunction back-contact cell 10 in accordance with Embodiment 1. The p-electrodes 7 and the n-electrodes 8 may be formed, for example, by sputtering using a mask.

Heterojunction Back-Contact Cell Complete with Wiring Sheet

Figure 10:
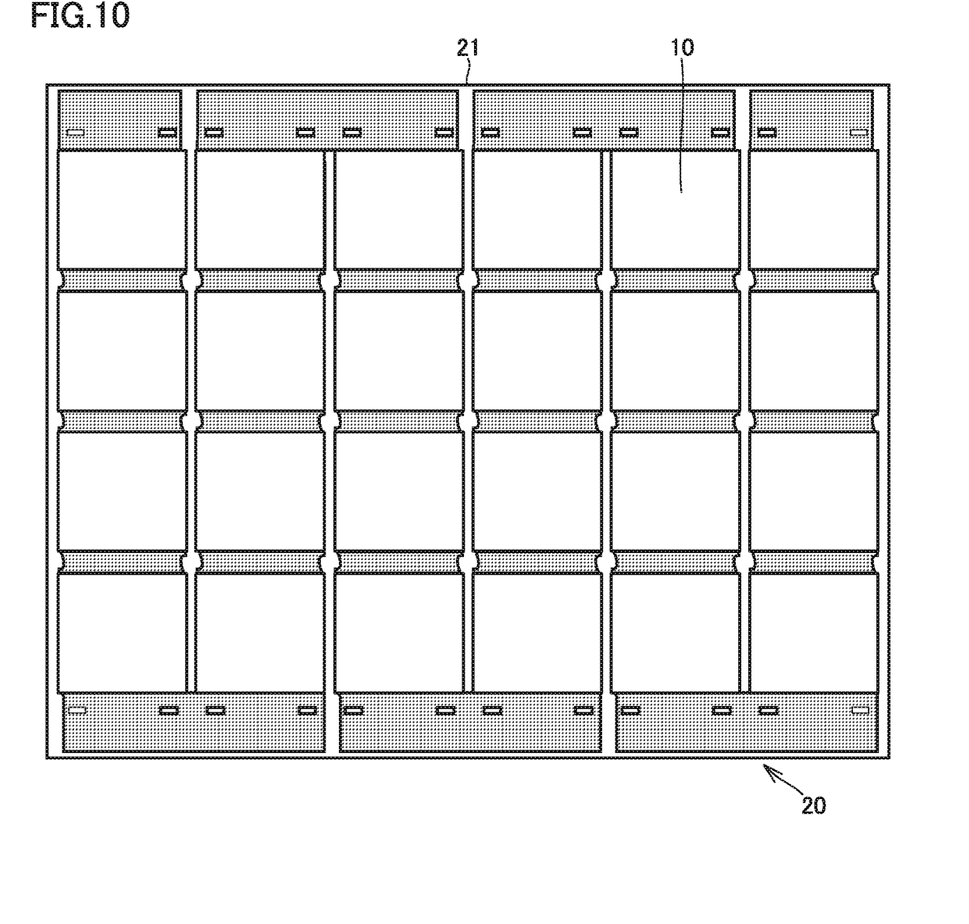
FIG. 10 is a schematic plan view of heterojunction back-contact cells on a wiring sheet in accordance with Embodiment 1.

FIG. 10 is a schematic plan view of heterojunction back-contact cells on a wiring sheet in accordance with Embodiment 1. The heterojunction back-contact cells complete with a wiring sheet in accordance with Embodiment 1 includes a plurality of electrically series-connected heterojunction back-contact cells 10 in accordance with Embodiment 1 on a wiring sheet 20, for example, as shown in FIG. 10.

Figure 11:
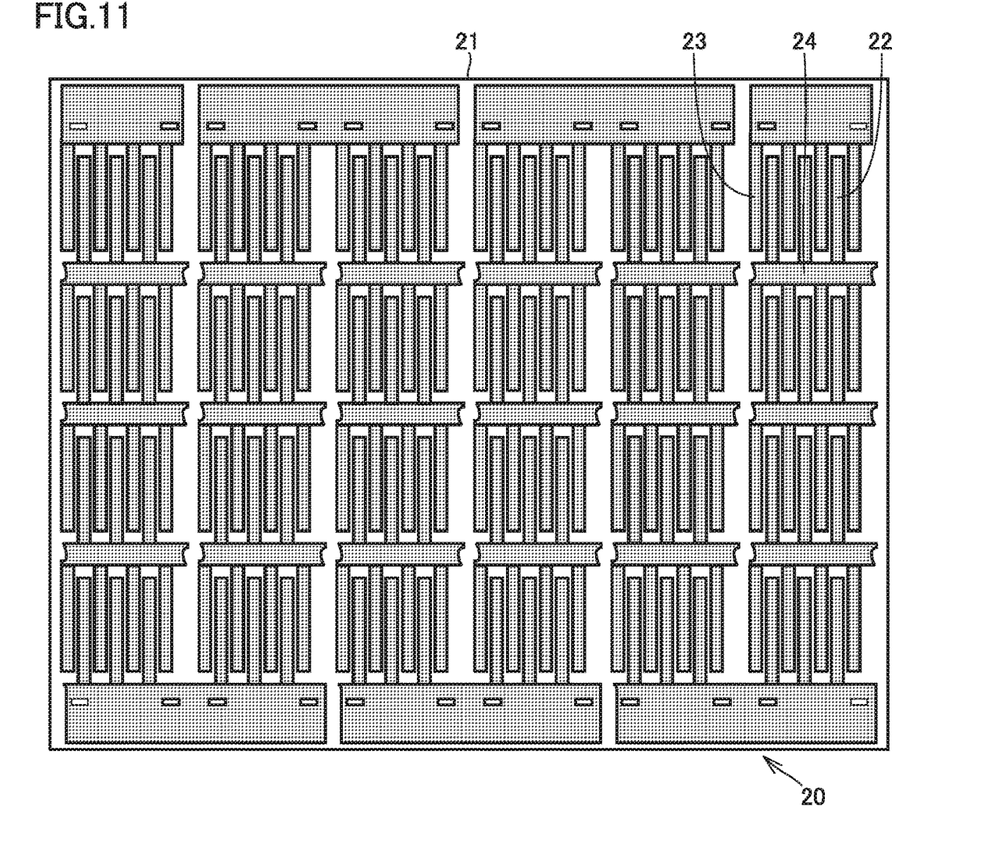
FIG. 11 is a schematic plan view of a wiring sheet for use with heterojunction back-contact cells in accordance with Embodiment 1.

FIG. 11 is a schematic plan view of the wiring sheet 20 for use with heterojunction back-contact cells in accordance with Embodiment 1. The wiring sheet 20 includes an insulating base member 21 and first wires 22 and second wires 23 provided on the insulating base member 21. Both the first wires 22 and the second wires 23 are formed like strips arranged at intervals on the insulating base member 21. The first wires 22 and the second wires 23 are arranged alternately in such a manner as to match the lengthwise directions thereof. The first wires 22 and the second wires 23 each have an end thereof electrically connected to one of strip-shaped power collection wires 24. The power collection wires 24 are disposed on the insulating base member 21 in such a manner as to have a lengthwise direction perpendicular to the lengthwise direction of the first wires 22 and the second wires 23. The power collection wires 24 collect electric current from the first wires 22 or the second wires 23 and electrically connect the heterojunction back-contact cells 10 in accordance with Embodiment 1 in series.

The insulating base member 21 may be made of any insulating base material including a film of polyester, polyethylene naphthalate, or polyimide.

The first wires 22, the second wires 23, and the power collection wires 24 may be made of any electrically conductive material including copper. The first wires 22, the second wires 23, and the power collection wires 24 may be formed, for example, by forming an electrically conductive film, such as a metal film, across the entire surface of the insulating base member 21 and then removing parts of the film (i.e., patterning the film) by etching or a like method.

Figure 12:
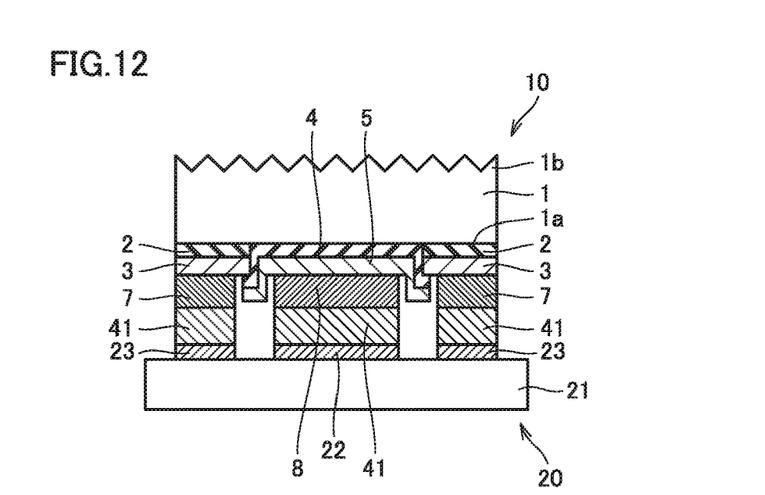
FIG. 12 is a schematic cross-sectional view of a heterojunction back-contact cell complete with a wiring sheet in accordance with Embodiment 1.

FIG. 12 is a schematic cross-sectional view of a heterojunction back-contact cell complete with a wiring sheet in accordance with Embodiment 1. Referring to FIG. 12, the first wires 22 on the wiring sheet 20 are electrically connected via a conductive layer 41 to the n-electrodes 8 in the heterojunction back-contact cell 10 in accordance with Embodiment 1 along the lengthwise directions thereof. Meanwhile, the second wires 23 on the wiring sheet 20 are electrically connected via the conductive layer 41 to the p-electrodes 7 in the heterojunction back-contact cell 10 in accordance with Embodiment 1 along the lengthwise directions thereof.

In Embodiment 1, the p-type amorphous semiconductor film 3 surrounds the n-type amorphous semiconductor film 5 in the in-plane direction of the semiconductor substrate, the edge portion 5a of the n-type amorphous semiconductor film 5 is an overlapping region where the n-type amorphous semiconductor film 5 overlaps the p-type amorphous semiconductor film 3, and the n-electrodes 8 are disposed in the areas of the n-type amorphous semiconductor film 3 that are surrounded by the overlapping region. Therefore, the n-type semiconductor substrate 1 efficiently collects electric current at the periphery thereof by reducing leakage caused by the unstable shape of the periphery of the n-type semiconductor substrate 1.

In Embodiment 1, if each p-electrode 7 is extended toward the periphery of the n-type semiconductor substrate 1 beyond the proximate ends 8a of the adjacent n-electrodes 8, the end 7a of the p-electrode 7 is separated from the periphery of the n-type semiconductor substrate 1 by the distance L1, which is from 0 mm to 1 mm inclusive, and the end 7a of the p-electrode 7 is separated from the proximate ends 8a of the adjacent n-electrodes 8 by the distance L2, which is from 0.3 mm to 2 mm inclusive, the p-electrodes 7 can collect current with improved efficiency, and improper patterning of electrodes (e.g., the n-electrodes 8 extending beyond the periphery of the n-type semiconductor substrate 1) becomes less likely to occur.

Embodiment 2

Figure 13A:
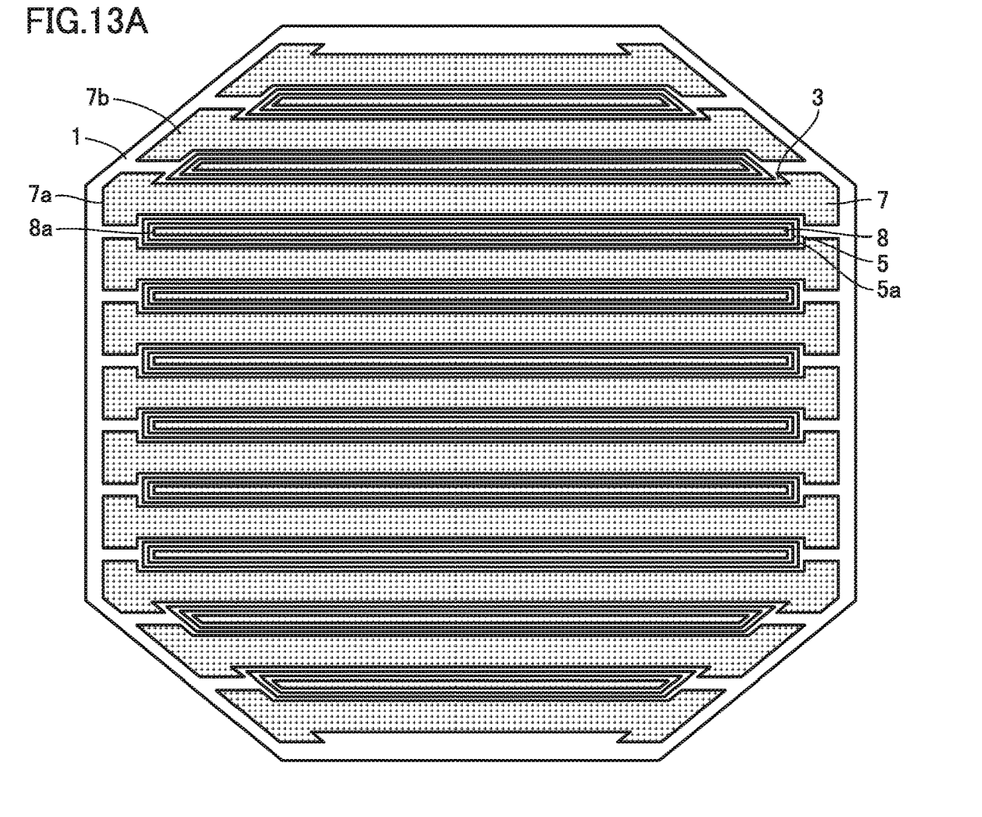
FIG. 13A is a schematic plan view of a back face of a heterojunction back-contact cell in accordance with Embodiment 2.
Figure 13B:
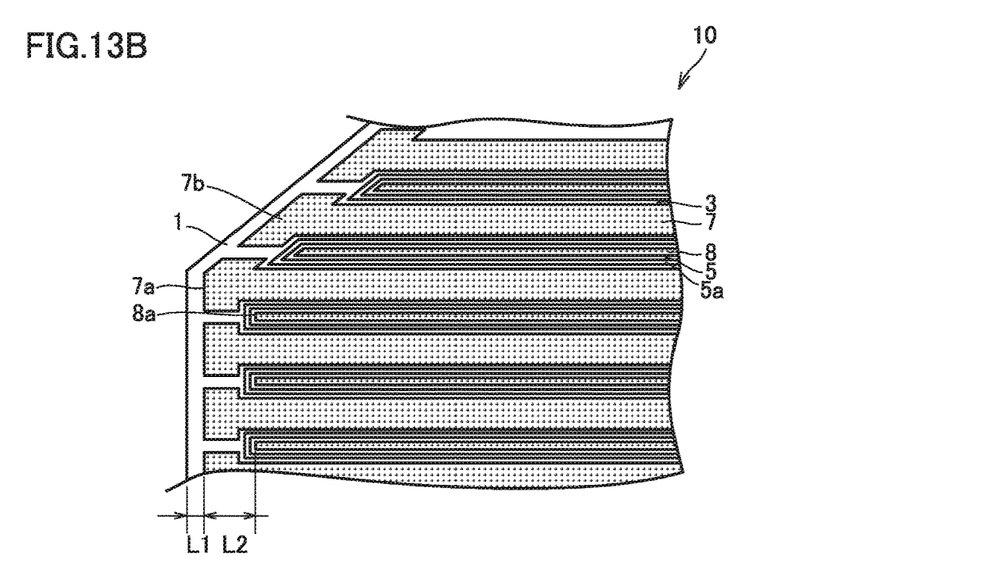
FIG. 13B is a schematic enlarged plan view of the back face of the heterojunction back-contact cell in accordance with Embodiment 2.

FIG. 13A is a schematic plan view of a back face of a heterojunction back-contact cell 10 in accordance with Embodiment 2. FIG. 13B is a schematic enlarged plan view of the back face of the heterojunction back-contact cell 10 in accordance with Embodiment 2. Referring to FIGS. 13A and 13B, the heterojunction back-contact cell 10 in accordance with Embodiment 2 is characterized in that the p-electrodes 7 have, near the periphery of the n-type semiconductor substrate 1, an end 7b where the p-electrodes 7 are broadened in a direction that differs from the extension direction of the p-electrodes 7. Since the p-electrodes 7 are not shaped like a comb, adjacent ends 7b of the p-electrodes 7 are separated by a distance from each other.

Embodiment 2 is the same as Embodiment 1 unless explicitly stated above. No such description is repeated here.

Embodiment 3

A heterojunction back-contact cell 10 in accordance with Embodiment 3 is characterized in that the first laminate 51 and the second laminate 52 are partially removed under laser radiation instead of using the etching paste 31 and the etching mask 32 respectively.

Figure 14:
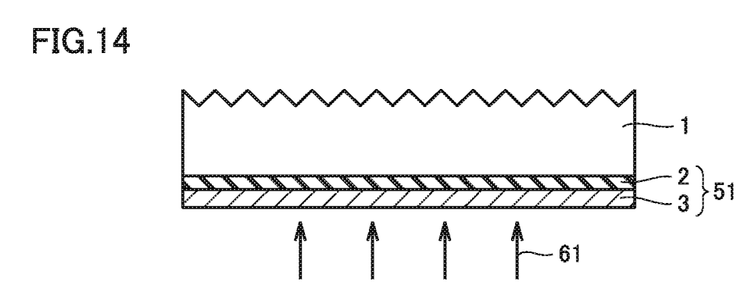
FIG. 14 is a schematic cross-sectional view illustrating an example method of removing parts of a first laminate by laser irradiation in Embodiment 3.

FIG. 14 is a schematic cross-sectional view illustrating an example method of removing parts of the first laminate 51 by laser irradiation. Referring to FIG. 14, laser light 61 is shone onto parts of the p-type amorphous semiconductor film 3 in the first laminate 51 to heat and evaporate the parts of the first laminate 51. The first laminate 51 is thus partially removed.

Figure 15:
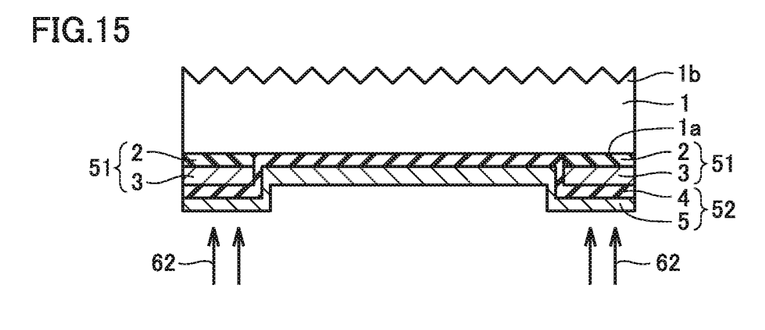
FIG. 15 is a schematic cross-sectional view illustrating an example method of removing parts of a second laminate by laser irradiation in Embodiment 3.

FIG. 15 is a schematic cross-sectional view illustrating an example method of removing parts of the second laminate 52 by laser irradiation. Referring to FIG. 15, laser light 62 is shone onto parts of the n-type amorphous semiconductor film 5 in the second laminate 52 to heat and evaporate the parts of the second laminate 52. The second laminate 52 is thus partially removed.

Embodiment 3 is the same as Embodiments 1 and 2 unless explicitly stated above. No such description is repeated here.

Embodiment 4

Figure 16A:
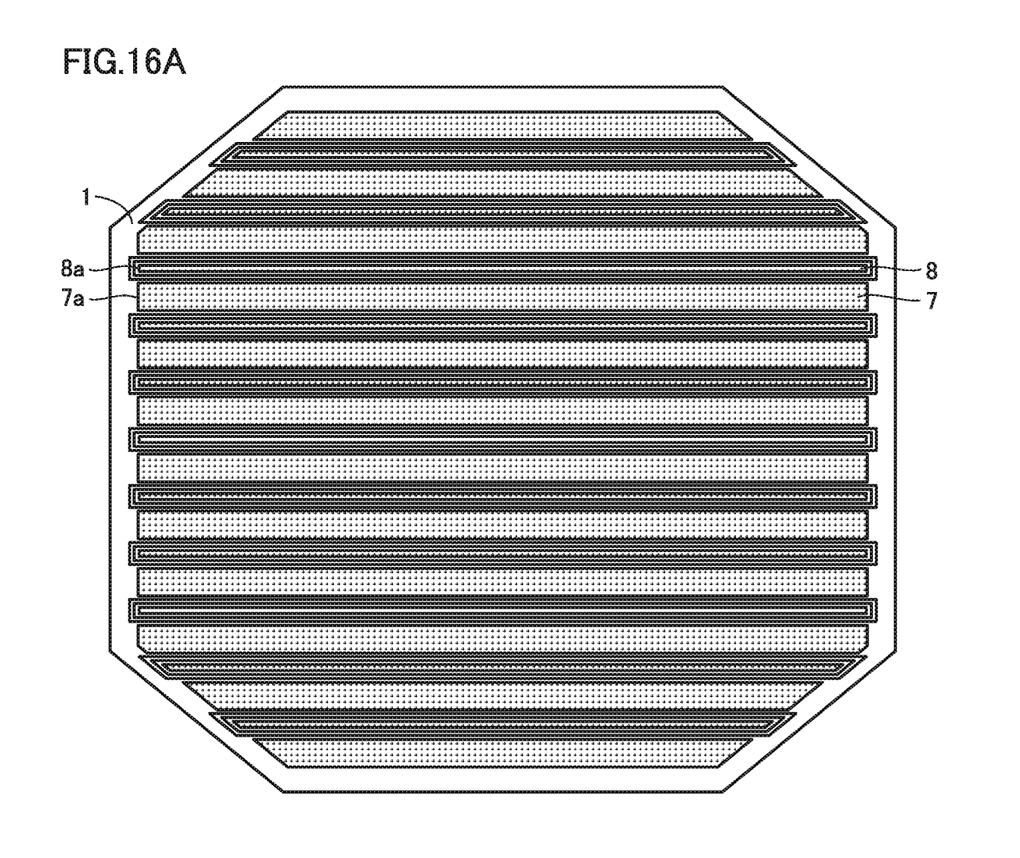
FIG. 16A is a schematic plan view of a back face of a heterojunction back-contact cell in accordance with Embodiment 4.
Figure 16B:
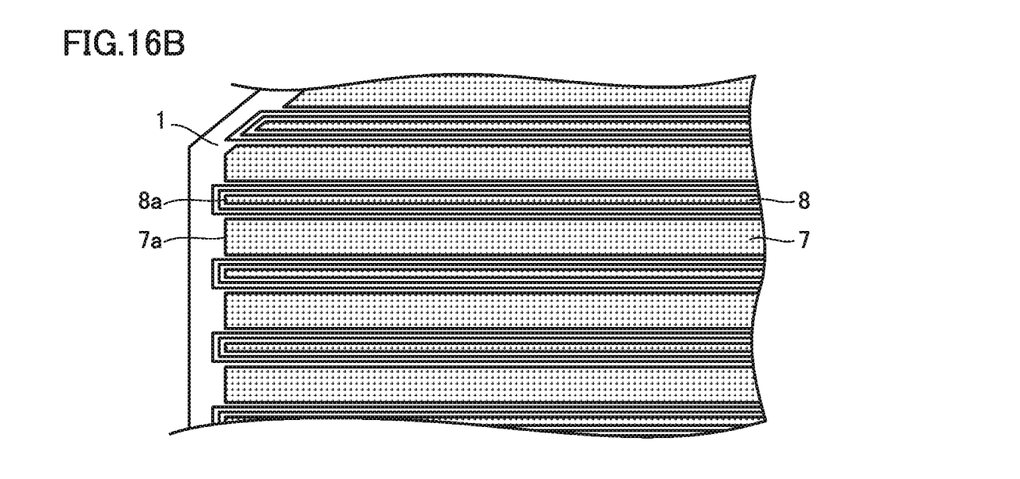
FIG. 16B is a schematic enlarged plan view of the back face of the heterojunction back-contact cell in accordance with Embodiment 4.

FIG. 16A is a schematic plan view of a back face of a heterojunction back-contact cell 10 in accordance with Embodiment 4. FIG. 16B is a schematic enlarged plan view of the back face of the heterojunction back-contact cell 10 in accordance with Embodiment 4. The heterojunction back-contact cell 10 in accordance with Embodiment 4 is characterized in that the ends 7a of the p-electrodes 7 near the periphery of the n-type semiconductor substrate 1 are aligned with the ends 8a of the n-electrodes 8 near the periphery of the n-type semiconductor substrate 1.

Embodiment 4 is the same as Embodiments 1 to 3 unless explicitly stated above. No such description is repeated here.

Embodiment 5

Figure 17:
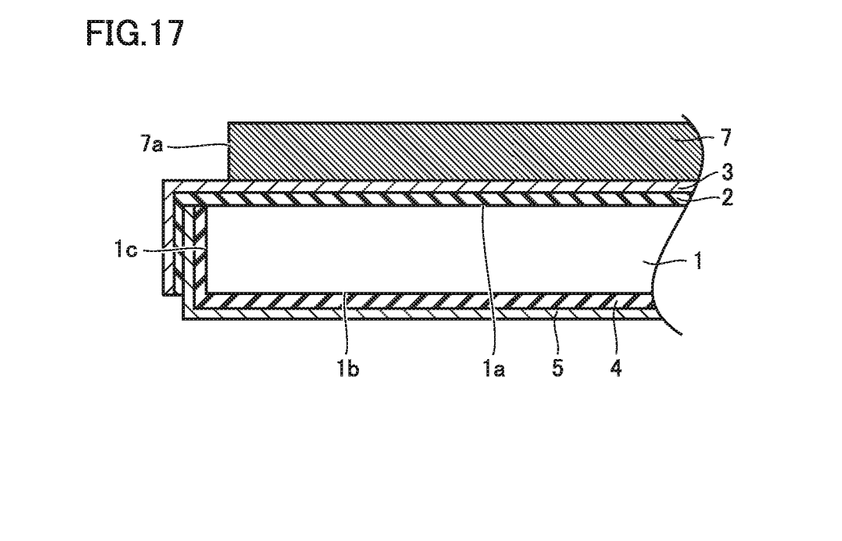
FIG. 17 is a schematic enlarged cross-sectional view of a peripheral part of a heterojunction back-contact cell in accordance with Embodiment 5.

FIG. 17 is a schematic enlarged cross-sectional view of a peripheral part of a heterojunction back-contact cell 10 in accordance with Embodiment 5. In the heterojunction back-contact cell 10 in accordance with Embodiment 5, the i-type amorphous semiconductor film 4 and the n-type amorphous semiconductor film 5 are extended covering all the way from the second face 1a (i.e., light-receiving face) to a side face 1c of the n-type semiconductor substrate 1, and the i-type amorphous semiconductor film 2 and the p-type amorphous semiconductor film 3 are extended covering all the way from the first face 1b (i.e., back face) to the side face 1c of the n-type semiconductor substrate 1.

The heterojunction back-contact cell 10 in accordance with Embodiment 5 is characterized in that the p-electrodes 7 are extended short of reaching the side face 1c of the n-type semiconductor substrate 1 and that the i-type amorphous semiconductor film 2 reaches beyond the i-type amorphous semiconductor film 4.

Embodiment 5 is the same as Embodiments 1 to 4 unless explicitly stated above. No such description is repeated here.

Embodiment 6

Figure 18:
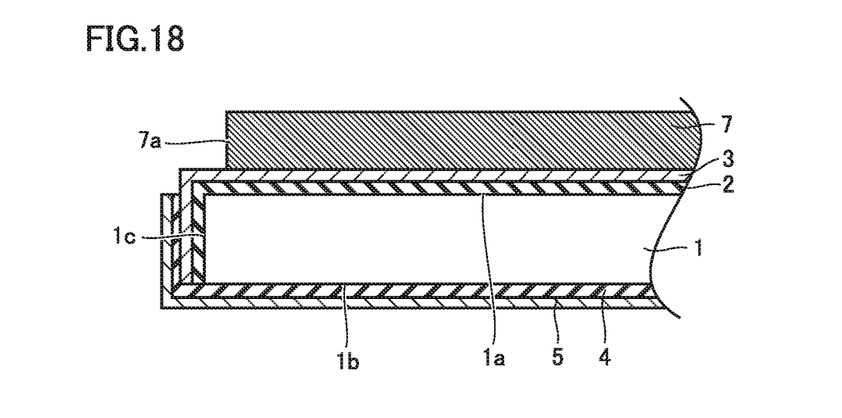
FIG. 18 is a schematic enlarged cross-sectional view of a peripheral part of a heterojunction back-contact cell in accordance with Embodiment 6.

FIG. 18 is a schematic enlarged cross-sectional view of a peripheral part of a heterojunction back-contact cell 10 in accordance with Embodiment 6. The heterojunction back-contact cell 10 in accordance with Embodiment 6 is characterized in that the p-electrodes 7 are extended short of reaching the side face 1c of the n-type semiconductor substrate 1 and that the i-type amorphous semiconductor film 4 reaches beyond the i-type amorphous semiconductor film 2.

Embodiment 6 is the same as Embodiments 1 to 5 unless explicitly stated above. No such description is repeated here.

Embodiment 7

Figure 19:
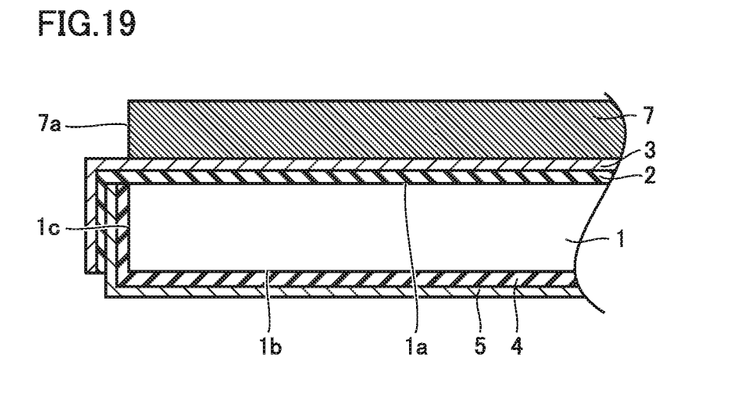
FIG. 19 is a schematic enlarged cross-sectional view of a peripheral part of a heterojunction back-contact cell in accordance with Embodiment 7.

FIG. 19 is a schematic enlarged cross-sectional view of a peripheral part of a heterojunction back-contact cell 10 in accordance with Embodiment 7. The heterojunction back-contact cell 10 in accordance with Embodiment 7 is characterized in that the ends 7a of the p-electrodes 7 are aligned with the side face 1c of the n-type semiconductor substrate 1 and that the i-type amorphous semiconductor film 2 reaches beyond the i-type amorphous semiconductor film 4.

Embodiment 7 is the same as Embodiments 1 to 6 unless explicitly stated above. No such description is repeated here.

Embodiment 8

Figure 20:
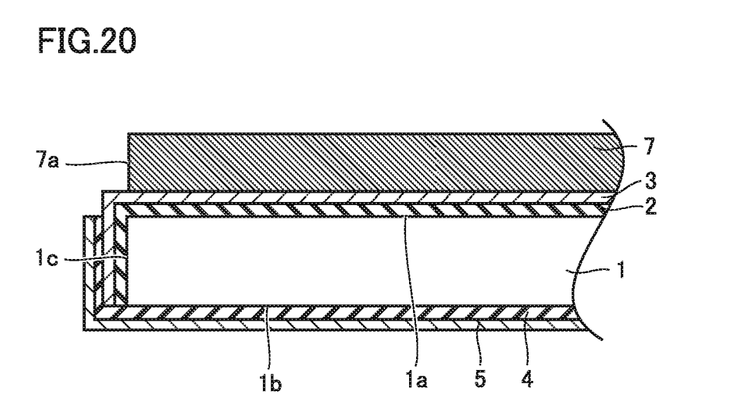
FIG. 20 is a schematic enlarged cross-sectional view of a peripheral part of a heterojunction back-contact cell in accordance with Embodiment 8.

FIG. 20 is a schematic enlarged cross-sectional view of a peripheral part of a heterojunction back-contact cell 10 in accordance with Embodiment 8. The heterojunction back-contact cell 10 in accordance with Embodiment 8 is characterized in that the ends 7a of the p-electrodes 7 are aligned with the side face 1c of the n-type semiconductor substrate 1 and that the i-type amorphous semiconductor film 4 reaches beyond the i-type amorphous semiconductor film 2.

Embodiment 8 is the same as Embodiments 1 to 7 unless explicitly stated above. No such description is repeated here.

Additional Remarks (1) The present disclosure, in an embodiment thereof, is directed to a photovoltaic device including: a p- or n-type semiconductor substrate; a p-type amorphous semiconductor film on a first-face side of the semiconductor substrate; an n-type amorphous semiconductor film on the first-face side of the semiconductor substrate; p-electrodes on the p-type amorphous semiconductor film; and n-electrodes on the n-type amorphous semiconductor film, wherein: the p-electrodes and the n-electrodes are arranged at intervals; the p-type amorphous semiconductor film surrounds the n-type amorphous semiconductor film in an in-plane direction of the semiconductor substrate; the n-type amorphous semiconductor film has an edge portion providing an overlapping region where the n-type amorphous semiconductor film overlaps the p-type amorphous semiconductor film; and the n-electrodes are disposed in areas of the n-type amorphous semiconductor film that are surrounded by the overlapping region.

(2) In the photovoltaic device of an embodiment disclosed here, the p-type amorphous semiconductor film may be extended so as to cover a side face of the semiconductor substrate.

(3) In the photovoltaic device of an embodiment disclosed here, the p-electrodes may be extended closer to a periphery of the semiconductor substrate than are those n-electrodes that are adjacent to the p-electrodes. The p-electrodes may have ends thereof separated from the semiconductor substrate by a distance of from 0 mm to 1 mm inclusive. The p-electrodes may have ends thereof separated from proximate ends of the n-electrodes by a distance of from 0.3 mm to 2 mm inclusive.

(4) In the photovoltaic device of an embodiment disclosed here, the p-electrodes may have, near a periphery of the semiconductor substrate, ends thereof where the p-electrodes are broadened in a direction that differs from an extension direction of the p-electrodes.

(5) In the photovoltaic device of an embodiment disclosed here, the p-electrodes and the n-electrodes may be extended in a single direction.

(6) In the photovoltaic device of an embodiment disclosed here, the p-electrodes and the n-electrodes may be arranged like islands.

(7) The present disclosure, in an embodiment thereof, is directed to a photovoltaic unit including: any one of the foregoing photovoltaic devices; and a wiring sheet, wherein: the wiring sheet includes an insulating base member, first wires on the insulating base member, and second wires on the insulating base member; the p-electrodes are electrically connected to the first wires; and the n-electrodes are electrically connected to the second wires.

It is envisaged that the embodiments described in the foregoing may be combined where appropriate.

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

INDUSTRIAL APPLICABILITY

The embodiments in this disclosure are applicable to photovoltaic devices and photovoltaic units and may be preferably applicable to solar cells, methods of manufacturing solar cells, and solar cell modules, in particular, to heterojunction back-contact cells and heterojunction back-contact cells complete with a wiring sheet.

REFERENCE SIGNS LIST

1 N-type Semiconductor Substrate
1a First Face
1b Second Face
1c Side Face
2 I-type Amorphous Semiconductor Film
3 P-type Amorphous Semiconductor Film
3a Edge Portion
4 I-type Amorphous Semiconductor Film
4a Edge Portion
5 N-type Amorphous Semiconductor Film
5a Edge Portion
7 P-electrode
7a End
7b End
8 N-electrode
8a End
10 Heterojunction Back-contact Cell
20 Wiring Sheet
21 Insulating Base Member
22 First Wire
23 Second Wire
24 Power Collection Wire
31 Etching Paste
32 Etching Mask
41 Conductive Layer
51 First Laminate
52 Second Laminate
61, 62 Laser Light

The invention claimed is:
1. A photovoltaic device comprising:
a p-type or an n-type semiconductor substrate;

a p-type amorphous semiconductor film on a first-face side of the semiconductor substrate;
an n-type amorphous semiconductor film on the first-face side of the semiconductor substrate;
p-electrodes on the p-type amorphous semiconductor film; and
n-electrodes on the n-type amorphous semiconductor film,
wherein:
the p-electrodes and the n-electrodes are arranged at intervals;
the p-type amorphous semiconductor film surrounds the n-type amorphous semiconductor film;
the n-type amorphous semiconductor film has an edge portion providing an overlapping region where the n-type amorphous semiconductor film overlaps the p-type amorphous semiconductor film;
the n-electrodes are disposed in areas of the n-type amorphous semiconductor film that are entirely surrounded by the overlapping region;
in a plan view, the n-electrodes are entirely disposed in areas of the n-type amorphous semiconductor film that are surrounded by the overlapping region;
the p-electrodes are extended closer to a periphery of the semiconductor substrate than are the n-electrodes that are adjacent to the p-electrodes in a plan view; and
the p-electrodes and the n-electrodes are arranged spaced apart from one another.

2. The photovoltaic device according to claim 1, wherein the p-type amorphous semiconductor film is extended so as to cover a side face of the semiconductor substrate.

3. The photovoltaic device according to claim 1, wherein each of the p-electrodes has an end that is separated from the periphery of the semiconductor substrate by a distance of from 0 mm to 1 mm inclusive.

4. The photovoltaic device according to claim 1, wherein a distance between an end of each of the p-electrodes and a proximate end of each of the n-electrodes is 0.3 mm to 2 mm.

5. The photovoltaic device according to claim 1, wherein an end of each of the p-electrodes is broadened in a different direction from an extension direction of each of the p-electrodes.

6. A photovoltaic unit comprising:
the photovoltaic device according to claim 1; and
a wiring sheet,
wherein:
the wiring sheet includes an insulating base member, first wires on the insulating base member, and second wires on the insulating base member;
the p-electrodes are electrically connected to the first wires; and
the n-electrodes are electrically connected to the second wires.

* * * * *